(12) United States Patent
Taira et al.

(10) Patent No.: US 8,969,708 B2
(45) Date of Patent: Mar. 3, 2015

(54) SOLAR CELL MODULE

(71) Applicant: Sanyo Electric Co., Ltd., Moriguchi, Osaka (JP)

(72) Inventors: Shigeharu Taira, Amagasaki (JP); Satoshi Tohoda, Kobe (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 13/716,329

(22) Filed: Dec. 17, 2012

(65) Prior Publication Data

US 2013/0125953 A1 May 23, 2013

Related U.S. Application Data

(63) Continuation of application No. PCT/JP2011/064251, filed on Jun. 22, 2011.

(30) Foreign Application Priority Data

Jun. 30, 2010 (JP) ................................. 2010-150113

(51) Int. Cl.
*H01L 31/05* (2014.01)
*H01L 31/0224* (2006.01)

(52) U.S. Cl.
CPC .... *H01L 31/0508* (2013.01); *H01L 31/022433* (2013.01); *H01L 31/0512* (2013.01); *Y02E 10/50* (2013.01)
USPC ......................................... 136/244; 136/256

(58) Field of Classification Search
CPC ..................... H01L 31/042; H01L 31/022433; Y02E 10/50
USPC ................................................... 136/243–265
See application file for complete search history.

(56) References Cited

U.S. PATENT DOCUMENTS 4,301,322 A * 11/1981 Amick .......................... 136/256
2008/0121265 A1* 5/2008 Hishida et al. ................ 136/244
(Continued)

FOREIGN PATENT DOCUMENTS

JP 2006-013406 A 1/2006
JP 2006278710 A * 10/2006
(Continued)

OTHER PUBLICATIONS

English translation of International Preliminary Report on Patentability for PCT/JP2011/064251, mailed out on Feb. 12, 2013.*

*Primary Examiner* — James Lin
*Assistant Examiner* — Liesl C Baumann
(74) *Attorney, Agent, or Firm* — Marvin A. Motsenbocker; Mots Law, PLLC

(57) ABSTRACT

A solar cell module includes solar cells. Each solar cell has a first bus bar electrode on one principal surface, and a second bus bar electrode on the other principal surface; and a conductive connecting member. The conductive connecting member has a first principal surface in an uneven shape and a second principal surface in a flat shape, the second principal surface being on an opposite side of the first principal surface. The first bus bar electrode is connected to the second principal surface of the conductive connecting member. The second bus bar electrode is connected to the first principal surface of the conductive connecting member. A region width of the second bus bar electrode in a short side direction of the conductive connecting member is larger than that of the first bus bar electrode.

9 Claims, 11 Drawing Sheets

(56) References Cited

U.S. PATENT DOCUMENTS

| | | | |
|---|---|---|---|
| 2009/0194144 A1* | 8/2009 | Taira et al. | 136/244 |
| 2010/0243024 A1* | 9/2010 | Hashimoto et al. | 136/244 |
| 2011/0011440 A1* | 1/2011 | Hioki et al. | 136/244 |
| 2011/0011454 A1* | 1/2011 | Taira | 136/256 |
| 2012/0031457 A1* | 2/2012 | Taira et al. | 136/244 |
| 2012/0305047 A1 | 12/2012 | Taira et al. | |

FOREIGN PATENT DOCUMENTS

| | | |
|---|---|---|
| JP | 2008-159798 A | 7/2008 |
| JP | 2009-081204 A | 4/2009 |
| WO | 2007/122897 A1 | 11/2007 |
| WO | WO 2009099179 A1 * | 8/2009 |
| WO | WO 2009122977 A1 * | 10/2009 |
| WO | WO 2010095583 A1 * | 8/2010 |
| WO | 2011/021655 A1 | 2/2011 |

* cited by examiner

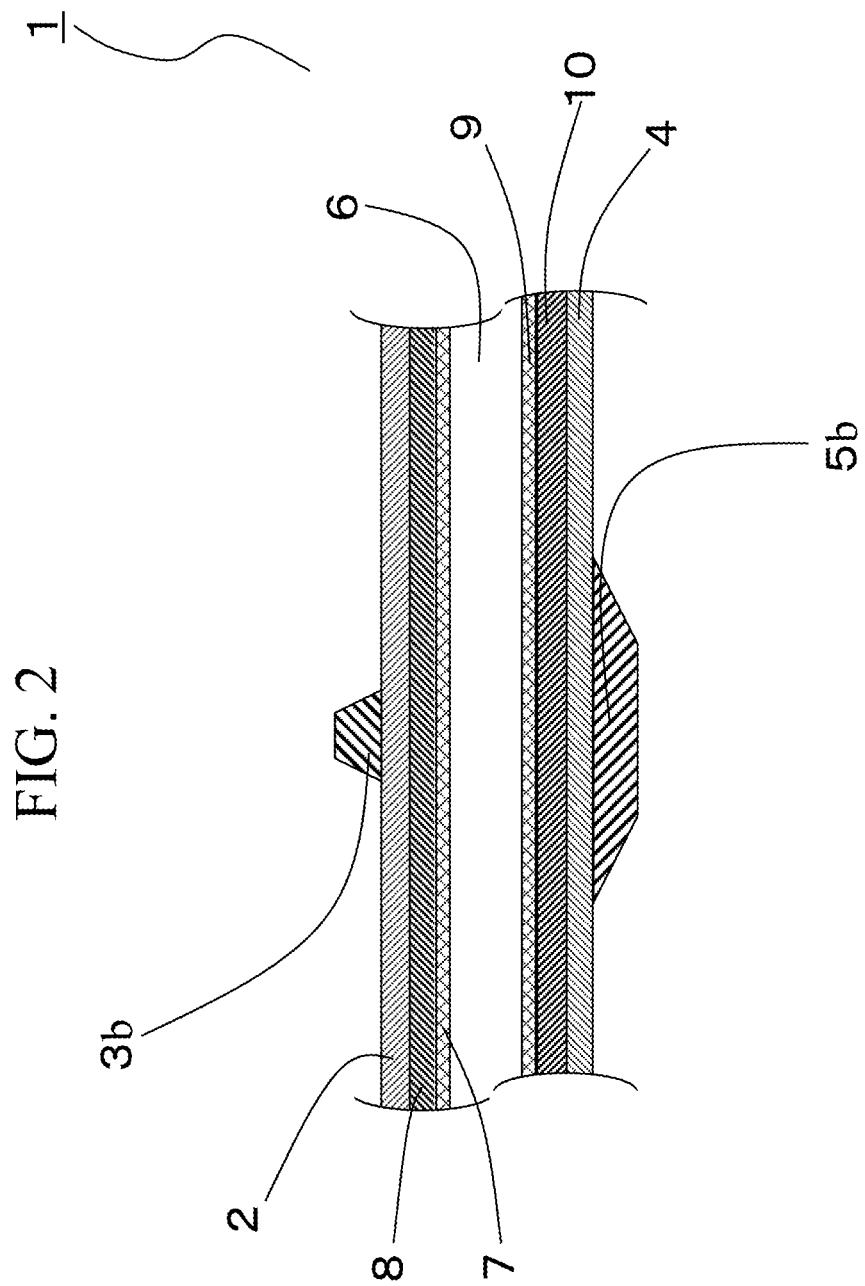

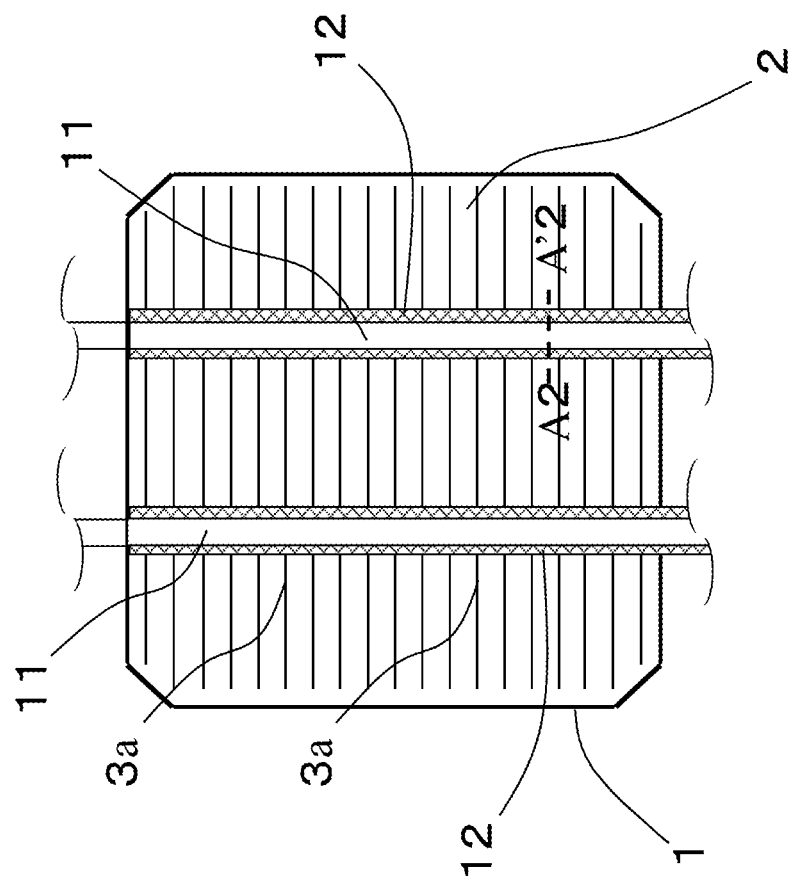

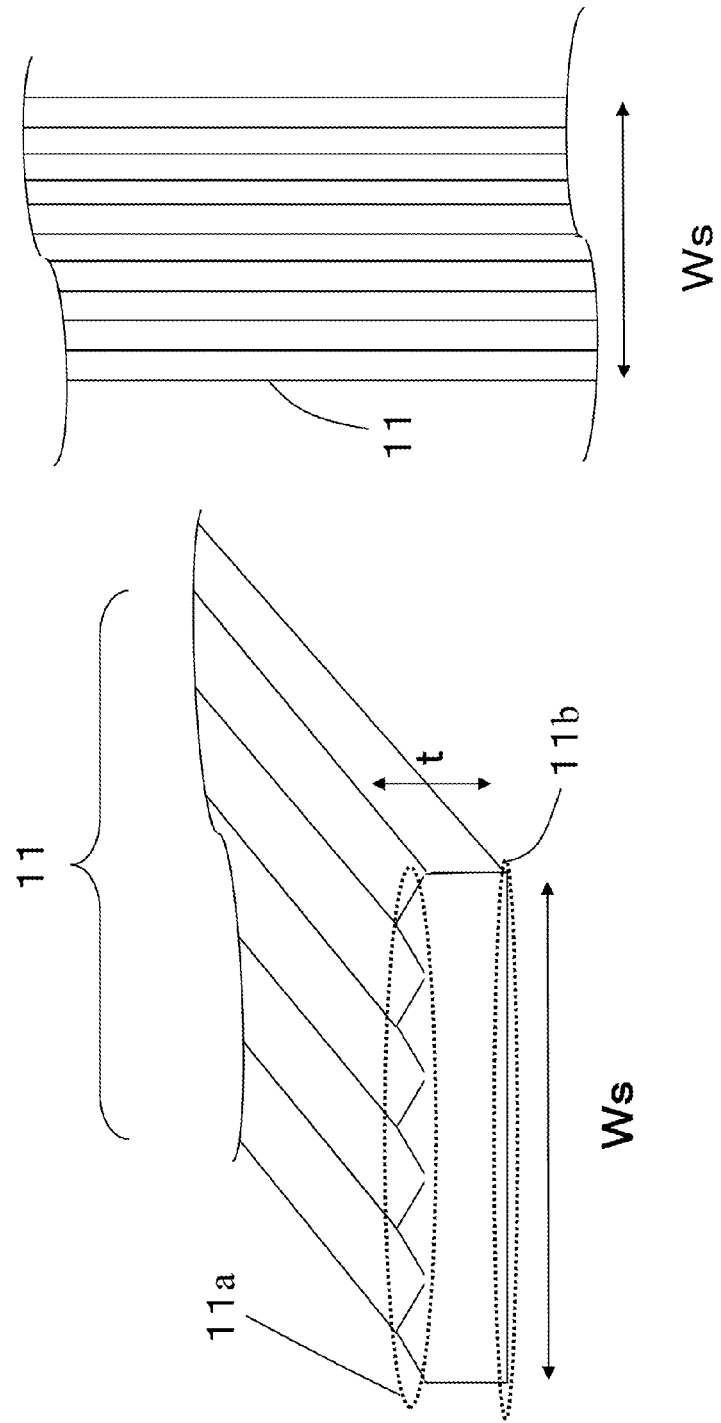

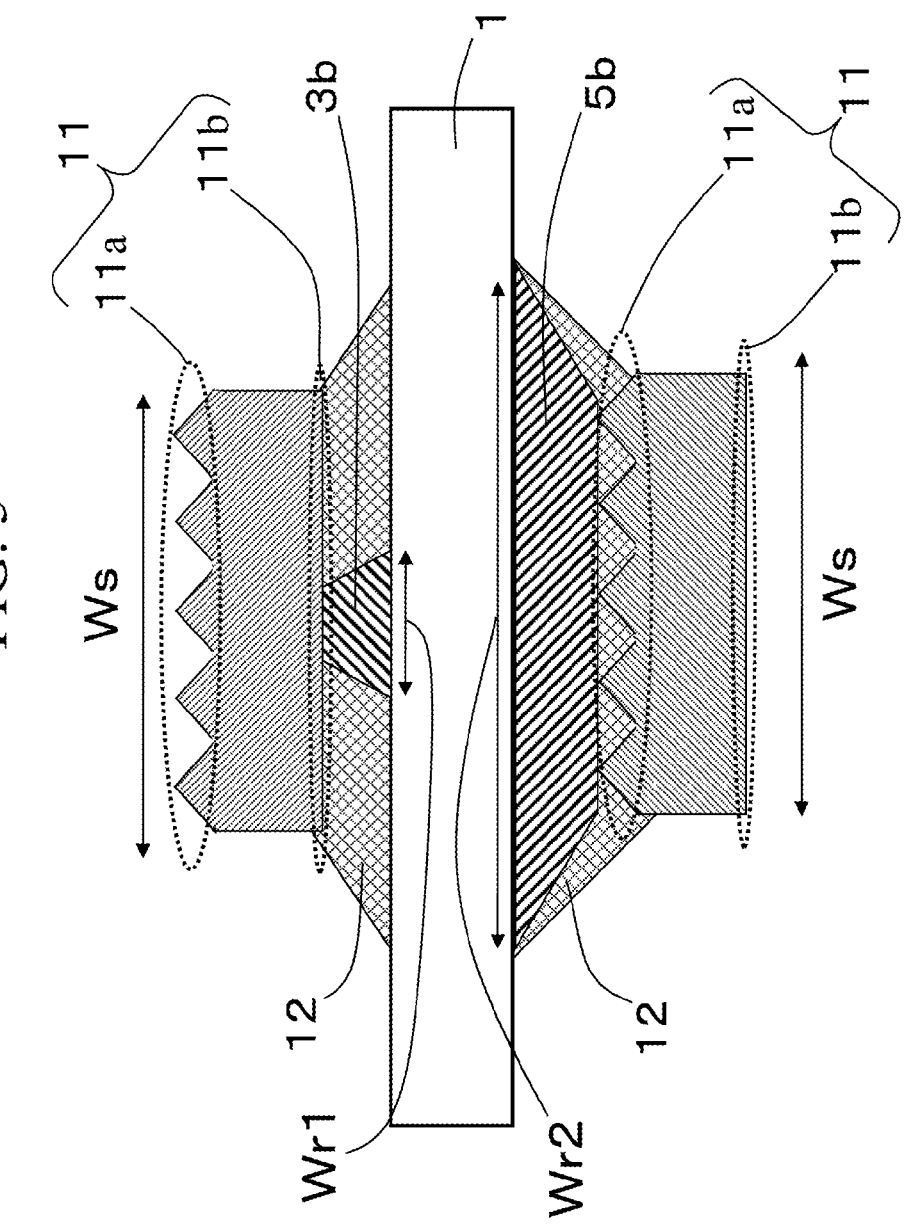

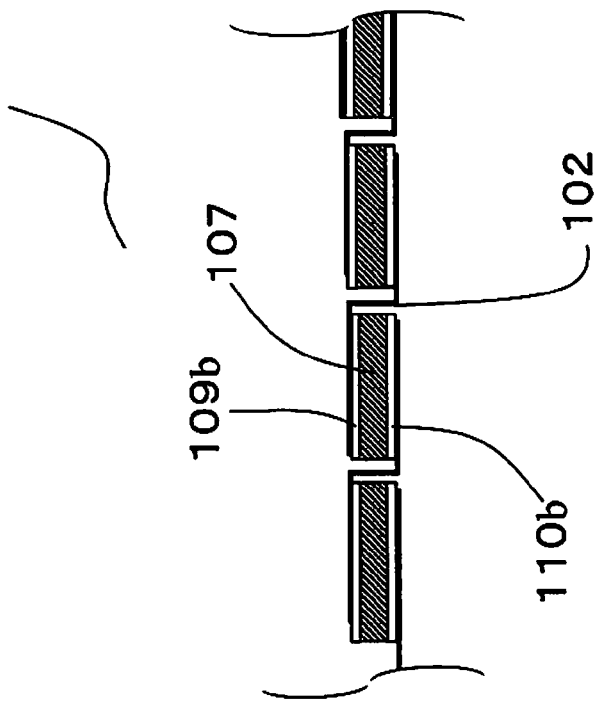
FIG. 11(a) -- prior art --
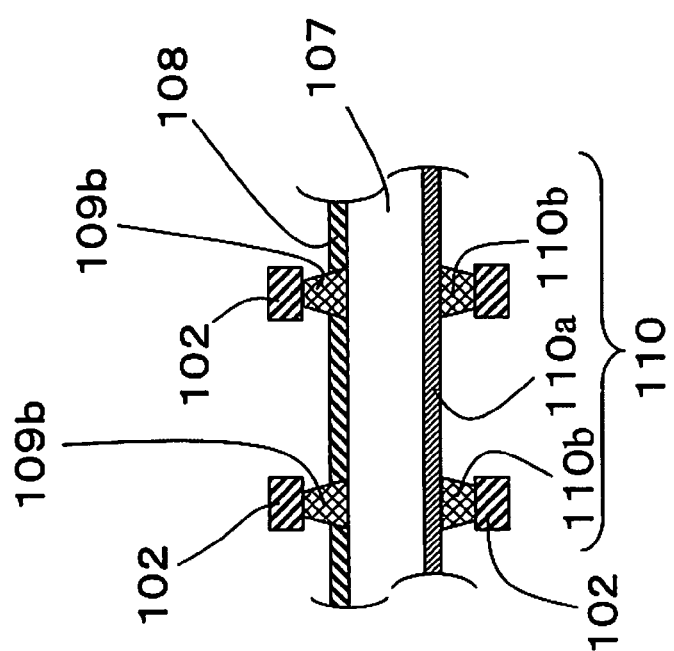
FIG. 11(b) -- prior art --

SOLAR CELL MODULE

CROSS REFERENCE TO RELATED APPLICATIONS

This application is a continuation application of International Application No. PCT/JP2011/064251, filed on Jun. 22, 2011, entitled "SOLAR CELL MODULE", which claims priority based on Article 8 of Patent Cooperation Treaty from prior Japanese Patent Applications No. 2010-150113, filed on Jun. 30, 2010, the entire contents of which are incorporated herein by reference.

BACKGROUND OF THE INVENTION

1. Field of the Invention

This disclosure relates to a solar cell module.

2. Description of Related Art

A solar cell module generally has a structure in which a plurality of cells are electrically connected in series to thereby enhance output therefrom (for example, Document 1: Japanese Patent Application Publication No. 2006-13406).

A structure of solar cell module 100 is described with reference to FIG. 9. Solar cell module 100 includes solar cell groups 103 having a plurality of solar cells 101 connected in series by using conductive connecting member 102. Solar cell groups 103 are connected to each other in such manner that each adjacent solar cell groups 103 are soldered by using connecting member 104 or 105.

With this structure, the series connection of the plurality of solar cells 101 leads to enhanced output from solar cell module 100.

In addition, outermost solar cell groups 103 are electrically connected to L-shaped connecting members (output extraction connecting members) 106 for extracting electric output from solar cell module 100.

As described above, solar cells 101 need to be electrically connected to one another by using conductive connecting members 102. Hereinbelow, the connection structure is described in detail.

First, a structure of each solar cell 101 is described in detail with reference to FIG. 10. Each solar cell 101 includes semiconductor substrate 107 having a PN junction, antireflection film 108 and front-surface-side electrode 109 which are formed on a front surface of semiconductor substrate 107, and rear-surface-side electrode 110 formed on a rear surface of semiconductor substrate 107.

Front-surface-side electrode 109 includes a plurality of finger-shaped collector electrodes 109a and bus bar electrodes 109b each orthogonally crossing collector electrodes 109a. In addition, rear-surface-side electrode 110 includes metal-film-shaped collector electrode 110a and bus bar electrodes 110b.

Next, the connection structure using conductive connecting members 102 is described in detail with reference to FIGS. 11(a) and 11(b). FIG. 11(a) is a cross-sectional view taken along the A-A' line in FIG. 9 for explaining the connection between solar cell 101 and conductive connecting members 102. FIG. 11(b) is a cross-sectional view taken along the B-B' line in FIG. 9 for explaining the connection between solar cells 101 in solar cell module 100 and conductive connecting members 102.

Each of conductive connecting members 102 connects one of bus bar electrodes 109b of one of solar cells 101 with one of bus bar electrodes 110b of an adjacent one of solar cells 101. Thereby, adjacent solar cells 101 are electrically connected to each other.

Document 1: Japanese Patent Application Publication No. 2006-13406

SUMMARY OF THE INVENTION

Here, Patent Document 1 discloses conductive connecting members each having an uneven surface or a texture surface on the light-receiving surface side.

That is, each conductive connecting member has one surface having an uneven shape and the other surface having a flat shape. When the conductive connecting member is connected to a bus bar electrode on the front surface side of a solar cell and a bus bar electrode on the rear surface side of a solar cell wherein both of the bus bar electrodes having the same width, the contact area between the one surface of the connecting member and the bus bar electrodes on the front surface side is smaller than the contact area between the other surface of the connecting member and the bus bar electrode on the rear surface side.

Accordingly, stress is applied to the solar cell, and the conductive connecting member might come off the solar cell.

A solar cell module according to an aspect of the invention includes: a solar cells each including a first bus bar electrode on one principal surface and a second bus bar electrode on an opposite principal surface; and a conductive connecting member electrically connecting the first bus bar electrode or the second bus bar electrode of one of the solar cells with the first bus bar electrode or the second bus bar electrode of another solar cell. The conductive connecting member includes a first principal surface in an uneven shape and a second principal surface in a flat shape which is opposite from the first principal surface. The first bus bar electrode is connected to the second principal surface of the conductive connecting member. The second bus bar electrode is connected to the first principal surface of the conductive connecting member. The second bus bar electrode has a larger region width in a short-side direction of the conductive connecting member than that of the first bus bar electrode.

The solar cell module according to the aspect can reduce stress to be applied to the solar cell.

BRIEF DESCRIPTION OF THE DRAWINGS

FIG. 2 is a projection view illustrating a cross section taken along the A1-A1' line in FIGS. 1(a) and 1(b).

FIG. 3 is a front-side plan view for explaining connection between the solar cell and conductive connecting members.

FIGS. 4(a) and 4(b) illustrate a structure of each of the conductive connecting members according to one embodiment of the invention.

FIG. 5 is a projection view showing a cross-section taken along the A2-A2' line in FIG. 3, illustrating connection structure between conductive connecting members and bus bar electrodes.

FIG. 11(a) is a cross-sectional view for explaining connection between the solar cell and conductive connecting members, and FIG. 11(b) is a cross-sectional view for explaining connection between the solar cells and the conductive connecting members in the conventional solar cell module.

DETAILED DESCRIPTION OF EMBODIMENTS

Figure 1A:
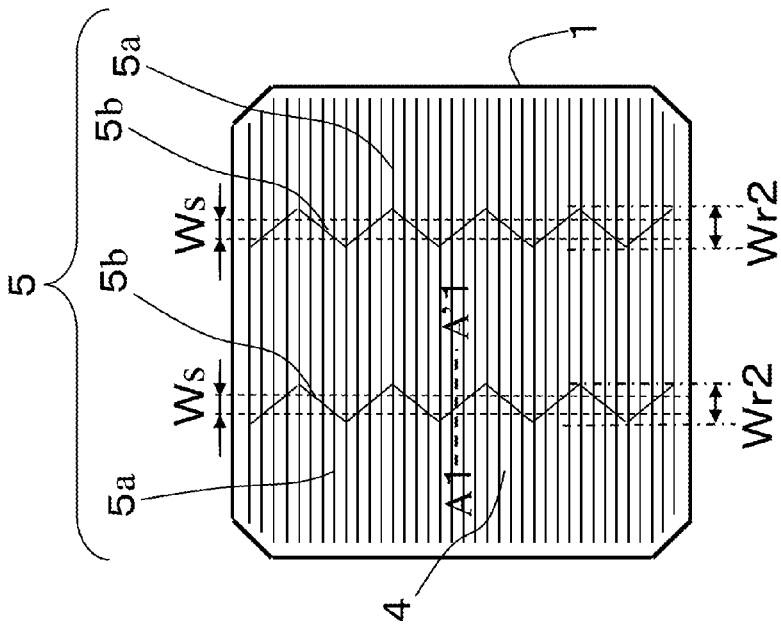
FIG. 1(a) illustrates a front-side plan view of a solar cell.

Hereinbelow, a solar cell module according to one embodiment of the invention is described in detail by referring to the drawings.

First, a structure of each of solar cells constituting the solar cell module is described in detail with reference to FIG. 1 and FIG. 2.

Figure 1B:
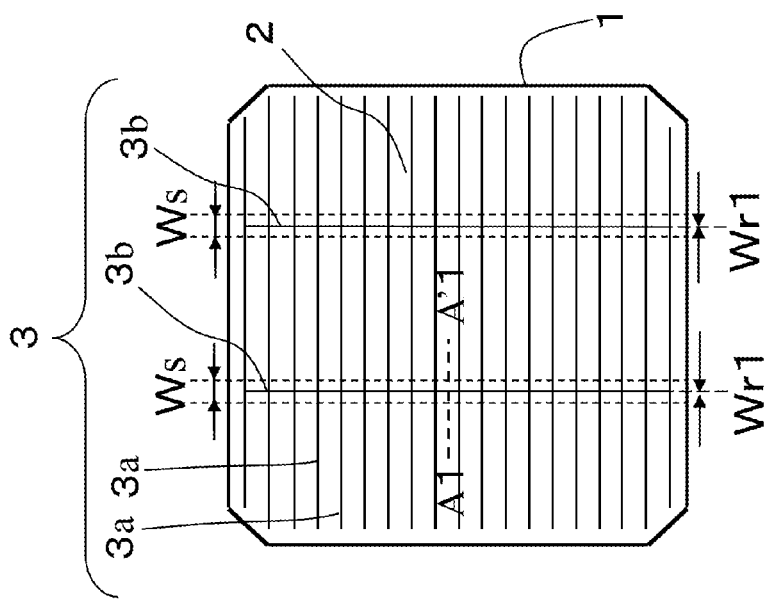
FIG. 1(b) illustrates a rear-side plan view of the solar cell.

FIG. 1(a) illustrates a front-side plan view of solar cell 1. FIG. 1(b) illustrates a rear-side plan view of solar cell 1.

With reference to FIG. 1(a), solar cell 1 includes transparent conductive film layer 2 and front-surface-side electrode 3 which are formed in this order on the front surface side.

Front-surface-side electrode 3 is formed by causing an epoxy-based thermosetting silver paste to be formed on transparent conductive film layer 2 by screen printing, offset printing, or the like, and then to be heated at 200° C. to thereby be hardened.

Front-surface-side electrode 3 includes a plurality of finger electrodes 3a and two bus bar electrodes 3b.

The plurality of finger electrodes 3a are formed in an almost entire region of a front surface of transparent conductive film layer 2. Finger electrodes 3a each have a fine-line shape and are arranged in parallel to each other. For example, each finger electrode 3a is shaped into a line having a thickness of 25 µm to 60 µm and a line width of 50 µm to 120 µm, and is arranged at intervals of 2 mm.

Each of two bus bar electrodes 3b is integrally formed so as to orthogonally cross and be connected to the plurality of finger electrodes 3a on the front surface of transparent conductive film layer 2. Each bus bar electrode 3b is shaped into a fine line. For example, bus bar electrode 3b is shaped into a line having a thickness of 25 µm to 60 µm and a line width of 80 µm to 500 µm.

Here, on the front surface side, a width of each conductive connecting member in a short-side direction is defined as Ws, and a width of each bus bar electrode 3b with respect to width Ws is defined as region width Wr1.

With reference to FIG. 1(b), solar cell 1 includes transparent conductive film layer 4 and rear-surface-side electrode 5 which are formed in this order on the rear surface side.

Rear-surface-side electrode 5 comprises a plurality of finger electrodes 5a and two zig-zag bus bar electrodes 5b.

In this embodiment, each adjacent finger electrodes 5a of rear-surface-side electrode 5 are formed at a narrower interval than an interval between each adjacent finger electrodes 3a of front-surface-side electrode 3.

Each of zig-zag bus bar electrodes 5b is integrally formed to be connected to the plurality of finger electrodes 5a on the rear surface of transparent conductive film layer 4. Each bus bar electrode 5b is shaped into a fine line and a zig-zag pattern having a plurality of fine-line-shaped straight sections. For example, each bus bar electrode 5b has a thickness of 10 µm to 30 µm and a line width of 80 µm to 500 µm.

In this embodiment, a width of each bus bar electrode 5b in the short-side direction with respect to width Ws of each conductive connecting member is defined as region width Wr2, as for the front surface side.

Next, a cross-sectional structure of solar cell 1 is described in detail with reference to FIG. 2. FIG. 2 is a projection view illustrating a cross section taken along the A1-A1' line in FIGS. 1(a) and 1(b).

Solar cell 1 includes n-type single crystal silicon substrate 6, i-type amorphous silicon layer 7, p-type amorphous silicon layer 8, transparent conductive film layer 2, bus bar electrodes 3b, i-type amorphous silicon layer 9, n-type amorphous silicon layer 10, transparent conductive film layer 4, and bus bar electrodes 5b.

N-type single crystal silicon substrate 6 has an approximately square flat shape having sides of about 125 mm and a thickness of 100 µm to 300 µm, for example.

Solar cell 1 includes, on the front-surface side, i-type amorphous silicon layer 7, p-type amorphous silicon layer 8, and transparent conductive film layer 2 which are formed in this order on a texture-structured front surface of n-type single crystal silicon substrate 6. In addition, front-surface-side electrode 3 is formed on transparent conductive film layer 2 in a predetermined location.

Likewise, solar cell 1 includes, on the rear surface side, i-type amorphous silicon layer 9, n-type amorphous silicon layer 10, and transparent conductive film layer 4 which are formed in this order on a texture-structured rear surface of n-type single crystal silicon substrate 6. In addition, rear-surface-side electrode 5 is formed on transparent conductive film layer 4 in a predetermined location.

Here, the solar cell may has reversed polarities with respect to those in the aforementioned solar cell 1, for example, the solar cell may have an n-type amorphous silicon layer on the front surface side and a p-type amorphous silicon layer on the rear surface side.

FIG. 3 is a front-side plan view for explaining connection between solar cell 1 and conductive connecting members 11.

Each of conductive connecting members 11 is connected to a corresponding one of bus bar electrodes 3b on the front surface side of solar cell 1 by using adhesive 12 containing a resin.

Here, a structure of each conductive connecting member 11 is described in detail with reference to FIGS. 4(a) and 4(b). FIG. 4(a) is a perspective view of conductive connecting member 11, and FIG. 4(b) is a top view of conductive connecting member 11.

Conductive connecting member 11 includes, on the upper side thereof, corrugated portion 11a or uneven portion having a structure in which a plurality of triangles having the same shape regularly arranged side by side in a cross section in the short-side direction of conductive connecting member 11 and the triangles parallelly extend in a longitudinal direction of conductive connecting member 11. In addition, conductive connecting member 11 has flat surface 11b on a lower side thereof.

Conductive connecting member 11 is a copper wire having width Ws of 0.8 mm to 1.5 mm and thickness t of approximately 150 µm to 300 µm. Corrugated portion 11a or a texture portion has a stripe pattern such that each of the triangle shapes of corrugated portion 11a has a bottom side of 100 µm and a height of 20 µm. Note that conductive connecting member 11 may be coated with a conductive layer of Sn—Ag—Cu, Ag or the like by a plating method, a dip method, or the like to make flat the entire lower surface of conductive connecting member 11 in such a manner that a periphery of conductive connecting member 11 is covered.

Next, FIG. 5 is a cross-sectional view taken along the A2-A2' line in FIG. 3, which is a projection view illustrating connection between one of conductive connecting members 11 and a corresponding one of bus bar electrodes 3b and connection between another one of conductive connecting members 11 and a corresponding one of bus bar electrodes 5b. The connection structure of conductive connecting members 11 is described in detail with reference to the projection view.

By using adhesive 12, each conductive connecting member 11 connects one of bus bar electrodes 3b on the front surface side of one of solar cells 1 and one of bus bar electrodes 5b on the rear surface side of another one of solar cells 1 adjacent to the one of solar cells 1.

For example, adhesive 12 is an epoxy-based thermosetting resin which is hardened by being heated at about 200° C.

Adhesive 12 is disposed between and connected to conductive connecting member 11 and front-surface-side electrode 3. For example, the connection is performed by disposing conductive connecting member 11 on adhesive 12 with adhesive 12 being disposed on bus bar electrode 3b. Adhesive 12 is also disposed between and connected to conductive connecting member 11 and rear-surface-side electrode 5. For example, the connection is performed by disposing conductive connecting member 11 on adhesive 12 with adhesive 12 being disposed on bus bar electrode 5b.

Conductive connecting members 11 are thermo-compression bonded onto bus bar electrodes 3b and 5b at about 2 MPa and about 200° C.

In this embodiment, region width Wr2 of rear surface side bus bar electrode 5b of solar cell 1 is larger than region width Wr1 of front surface side bus bar electrode 3b. This structure can reduce a difference between a contact area of front surface side bus bar electrode 3b to flat shape 11b of conductive connecting member 11 and a contact area of rear surface side bus bar electrode 5b to corrugated portion 11a of conductive connecting member 11. As the result, when solar cells 1 are modularized into solar cell module 13, concentration of stress to each solar cell 1 can be reduced. Accordingly, this can prevent conductive connecting members 11 from coming off bus bar electrodes 3b or 5b.

In addition, on the front surface side, region width Wr1 of linear-shaped bus bar electrode 3b is smaller than width Ws of conductive connecting member 11 in this embodiment. Bus bar electrode 3b is un-exposed from both widthwise sides of conductive connecting member 11.

When conductive connecting member 11 has width Ws of 1 mm, bus bar electrode 3b has a line width of 300 μm and region width Wr1 of 0.8 mm, for example.

Moreover, on the front surface side, flat shape 11b of conductive connecting member 11 is connected to bus bar electrode 3b. This structure stabilizes the connection of fine-line-shaped bus bar electrode 3b formed of a reduced volume of the electrode material, because the contact surface of conductive connecting member 11 to bus bar electrode 3b is flat shape 11b.

In this embodiment, on the rear surface side, region width Wr2 of zig-zag bus bar electrode 5b is larger than width Ws of conductive connecting member 11. Bus bar electrode 5b is exposed from both widthwise sides of conductive connecting member 11. It should be noted that region width Wr2 of bus bar electrode 5b is preferably equal to or larger than a value obtained by adding, to width Ws of conductive connecting member 11, a value of accuracy allowance in disposing conductive connecting member 11 on bus bar electrode 5b in a manufacturing process and a value of accuracy allowance in forming an electrode for bus bar electrode 5b. In the case where the conductive connecting member has width Ws of 1 mm, bus bar electrode 5b may have the line width of 300 μm and the region width of 1.5 mm, for example.

Meanwhile, on the rear surface side, corrugated portion 11a of conductive connecting member 11 is connected to zig-zag bus bar electrode 5b having the region width of Wr2. This structure consequently stabilizes the connection between conductive connecting member 11 and bar electrode 5b, even though the contact surface of conductive connecting member 11 to bas bar electrode 5b has corrugated portion 11a. This is because region width Wr2 of zig-zag bus bar electrode 5b is larger than width Ws of conductive connecting member 11.

As described above, on the light-receiving side of solar cell 1, bus bar electrode 3b having region width Wr1 is not exposed from both ends of width Ws of conductive connecting member 11. Thus, a decreased output due to light block can be prevented.

In contrast, since, on an opposite side of solar cell 1 opposed from the light-receiving side, since it is less likely to occur a decreased output due to light block, bus bar electrode 5b having region width Wr2 is exposed from width Ws of conductive connecting member 11.

In connecting such bus bar electrodes 3b and 5b and respective conductive connecting members 11, bus bar electrode 5b having region width Wr2 functions as a pad (a reinforcing member). Hence, bus bar electrode 5b absorbs the stress applied from conductive connecting member 11 to bus bar electrode 3b, so that solar cell 1 can be prevented from cracking.

Figure 10:
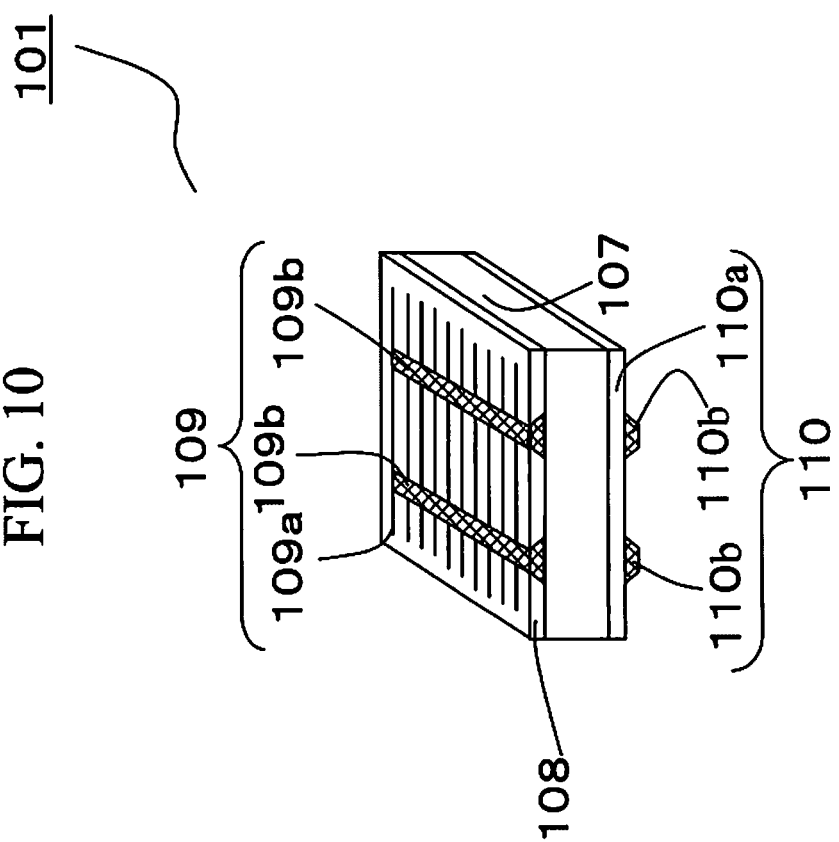
FIG. 10 is a perspective view of one of solar cells in the conventional solar cell module.

Such solar cell 1 is electrically connected to another solar cell 1 with conductive connecting member 11 located in between. Thereafter, a known modularization process is performed, so that solar cell module 13 as shown in FIG. 10 is completed.

In solar cell module 13, among light incident on the light-receiving side, light that reaches corrugated portions 11a of conductive connecting members 11 is reflected efficiently from corrugated portion 11a toward a filling material and a front surface side cover, which are not shown in the drawings. Hence, an amount of light reflected back from the filling material or the front surface side cover to solar cell 1 increases, and an amount of light incident on solar cell 1 consequently increases. Thus, output from solar cell 1 is enhanced.

Hereinbelow, other embodiments of the invention are described in detail with reference to FIGS. 6 and 7.

Figure 6:
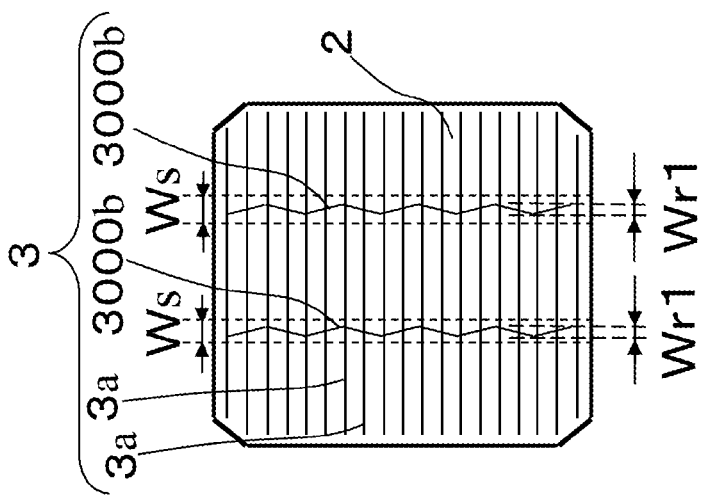
FIGS. 6(a1), 6(a2), and 6(a3) are front-side plan views illustrating shapes of the bus bar electrodes on the front surface side according to other embodiments of the invention.
Figure 6:
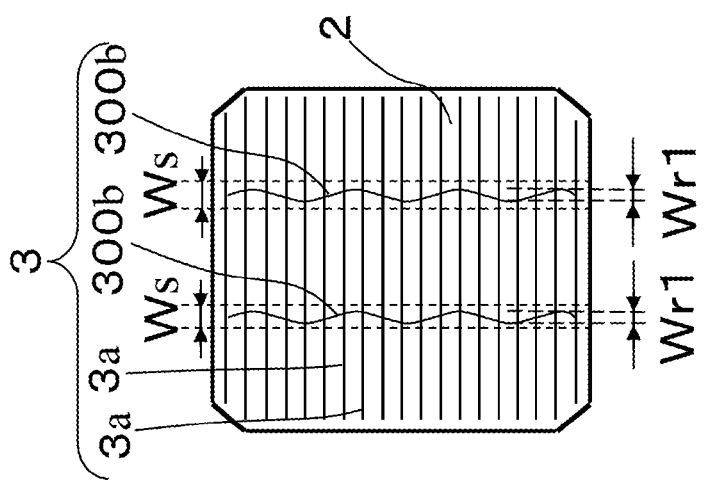
Figure 6:
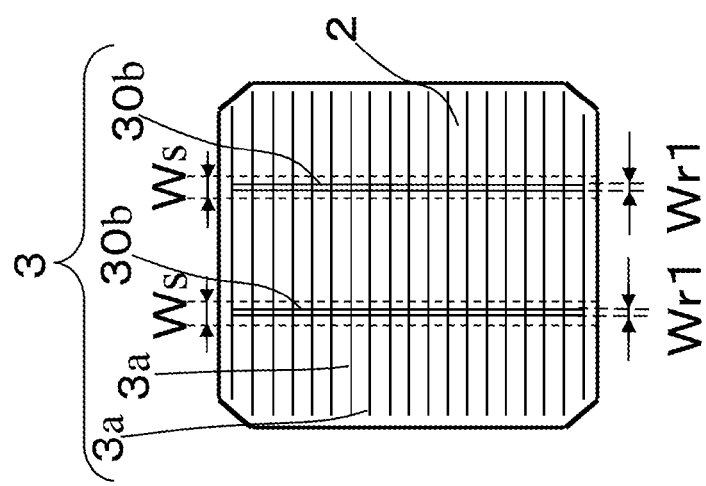
Figure 7:
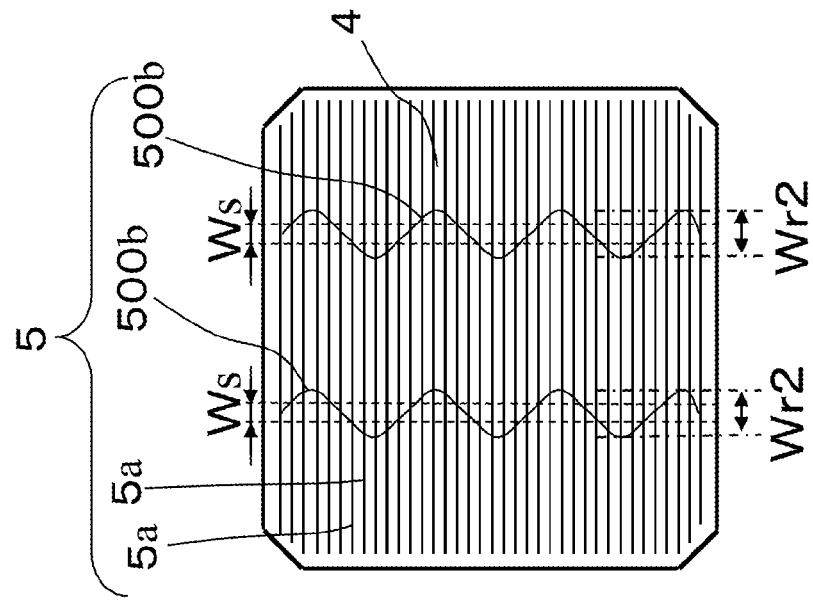
FIGS. 7(b1) and 7(b2) are rear-side plan views illustrating shapes of the bus bar electrodes on the rear surface side according to still other embodiments of the invention.
Figure 7:
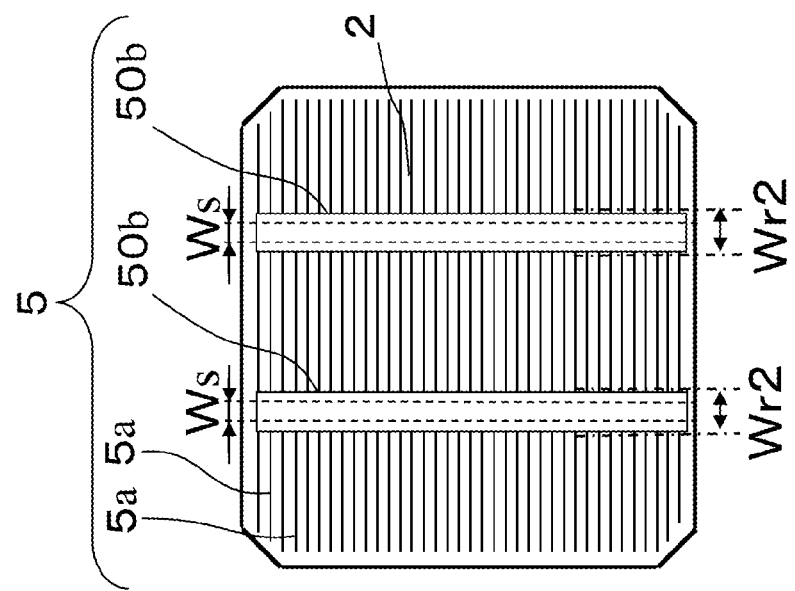

FIG. 6 illustrates three types of shapes of bus bar electrodes on the front surface side of solar cell 1 according to other embodiments. FIG. 7 illustrates two types of shapes of bus bar electrodes on the front surface side of solar cell 1 according to still other embodiments.

In these embodiments, the bus bar electrodes on the front surface side may be four linear-shaped bus bar electrodes 30b, wavy-shaped bus bar electrodes 300b, or the like.

In these configuration, region width Wr1 of each of front-side bus bar electrodes 30b, 300b, and 3000b is also smaller than width Ws of a corresponding one of conductive connecting members 11, and each of bus bar electrodes 30b, 300b, and 3000b is not exposed from both widthwise ends of corresponding conductive connecting member 11. For example, bus bar electrode 30b are formed into four lines each having a thickness of 25 μm to 60 μm and a line width of 80 μm to 200 μm. When each conductive connecting member 11 has width Ws of 1 mm, each bus bar electrode 30b has a line width of 100 μm and region width Wr1 of 0.8 mm, for example. Each of bus bar electrodes 300b is formed into a wavy shape having a thickness of 25 μm to 60 μm and a line width of 80 μm to 500 μm. When conductive connecting member 11 has width Ws of 1 mm, each bus bar electrode 300b has a line width of 80 μm and region width Wr1 of 0.8 mm, for example. Each of bus bar electrodes 3000b is formed into a zig-zag shape having a thickness of 25 μm to 60 μm and a line width of 80 μm to 500 μm. When conductive connecting member 11 has width Ws of 1 mm, bus bar electrode 3000b has a line width of 80 μm and region width Wr1 of 0.8 mm, for example.

In these embodiments, the bus bar electrodes on the rear surface side may be strip-shaped bus bar electrodes 50b, wavy-shaped bus bar electrodes 500b, or the like.

In these configuration, region width Wr2 of each of rear-side bus bar electrodes 50b and 500b is also larger than width Ws of corresponding conductive connecting member 11, and each of bus bar electrodes 50b and 500b is exposed from both widthwise ends of corresponding conductive connecting member 11. It should be noted that each of region widths Wr2 of bus bar electrodes 50b and 500b are preferably equal to or larger than a value obtained by adding, to width Ws of conductive connecting member 11, a value of accuracy allowance in disposing conductive connecting member 11 on corresponding bus bar electrode 5b or 500b in a manufacturing process and a value of accuracy allowance in forming an electrode for bus bar electrode 5b or 500b. Each bus bar electrode 50b is formed into a wide strip shape having a thickness of 10 μm to 30 μm and a line width of 0.8 mm to 3 mm. When conductive connecting member 11 has width Ws of 1 mm, bus bar electrode 50b has a line width of 1.5 mm and region width Wr2 of 1.5 mm, for example. Each bus bar electrode 500b is formed into a wavy shape having a thickness of 10 μm to 30 μm and a line width of 80 μm to 500 μm. When conductive connecting member 11 has width Ws of 1 mm, bus bar electrode 500b for example has a line width of 300 μm and region width Wr2 of 1.5 mm.

In the invention, the bus bar electrodes each having region width Wr1 on the front surface side and the bus bar electrodes having region width Wr2 on the rear surface side in the above embodiments can be combined appropriately.

Meanwhile, in the above embodiments, the bus bar electrodes on the front surface side of one of the solar cells and a corresponding one of the bus bar electrodes on the rear surface side of an adjacent one of the solar cells are connected in series. However, the connection of the adjacent solar cells is not limited to those in the above embodiments.

Figure 8:
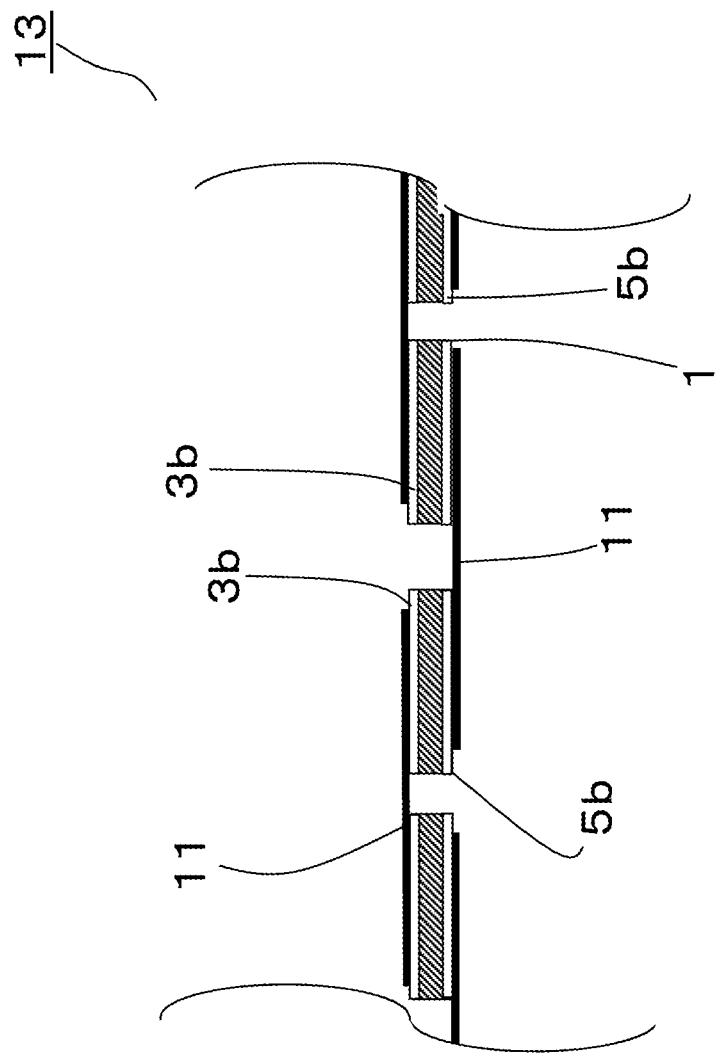
FIG. 8 is a partial cross-sectional view of a solar cell module according to yet another embodiment of the invention.
Figure 9:
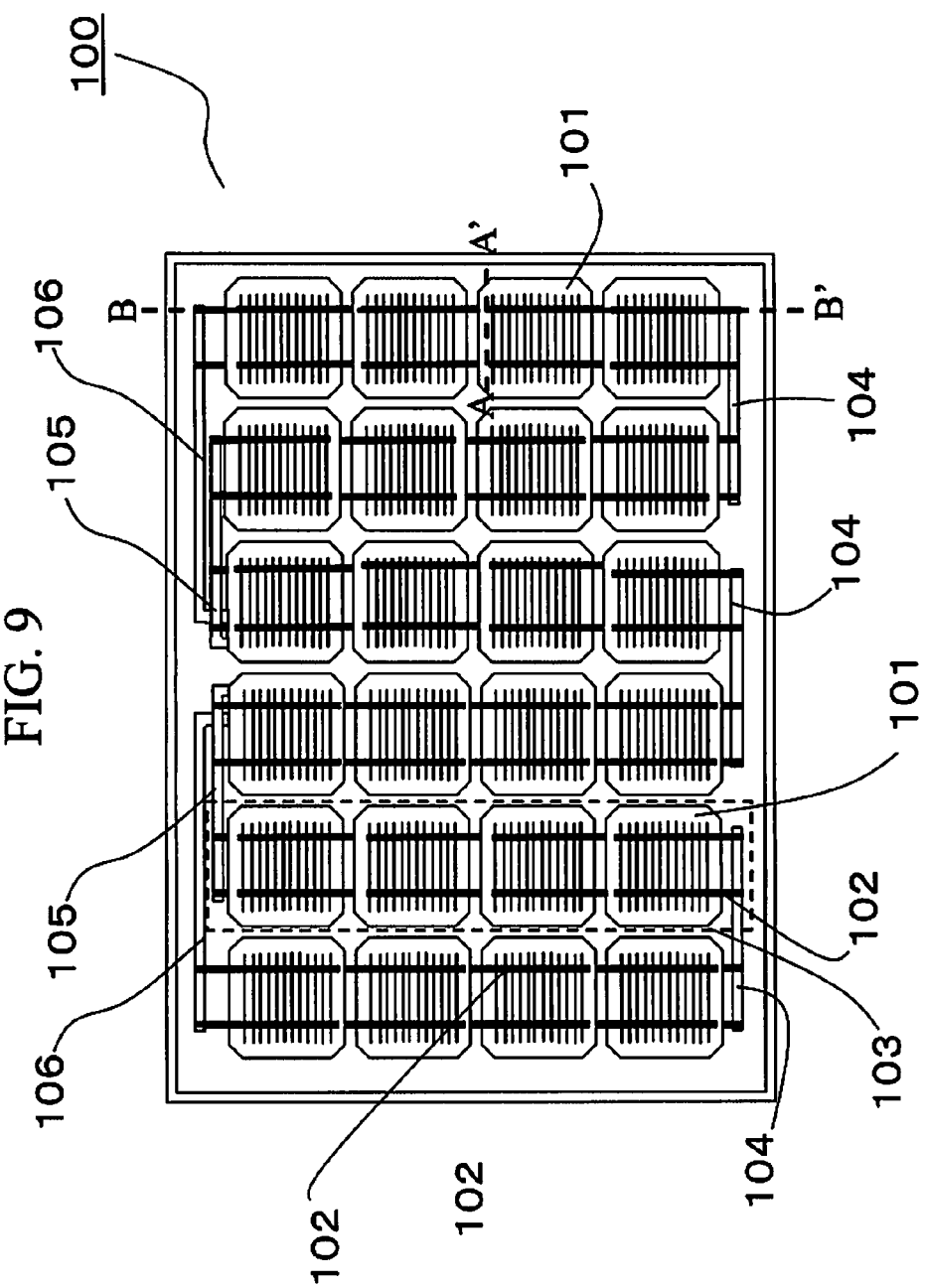
FIG. 9 is a front-side plan view for explaining a conventional solar cell module.

For example, a structure as in FIG. 8 may be employed. Note that in FIG. 8, the same reference numerals denote the same or similar components to those in the above embodiments.

Solar cell module 13 shown in FIG. 8 has a device configuration in which polarities of adjacent solar cells 1 are reverse to each other. On the front surface side, conductive connecting members 11 connect bus bar electrodes of adjacent solar cells 1 to each other, and also on the rear surface side, conductive connecting members 11 connect bus bar electrodes of adjacent solar cells 1 to each other. Also in this case, a flat lower surface of each conductive connecting member 11 is connected to a corresponding one of bus bar electrodes 3b on the front surface side, and an corrugated upper surface of each of conductive connecting member 11 is connected to a corresponding one of bus bar electrodes 5b on the rear surface side.

Note that the above embodiments are presented only to facilitate understanding of the invention, and thus not to provide limited interpretation of the invention. The invention can be modified or improved without departing from the gist thereof, and the equivalents of the invention are also included in the invention.

For example, the bus bar electrodes of each solar cell and the conductive connecting members are connected by using the adhesive in the aforementioned embodiments, but may be connected by melting and hardening of solder.

In addition, an insulating adhesive may be used as the adhesive. Alternatively, a conductive adhesive may be used. Moreover, the resin is not limited to the epoxy-based thermosetting resin, and an appropriate resin is usable.

Further, the adhesive may contain conductive particles or the like such as Ni or Ag, may contain a non-conductive material having non-conductive particles or the like such as Silicon oxide, may contain both of these materials, and may contain neither of these materials.

The invention is not limited to the structure of the solar cell shown in FIG. 2 and appropriately applicable to various solar cells such as a polycrystalline solar cell.

The invention claimed is:

1. A solar cell module comprises:
   solar cells each including a straight-shaped bus bar electrode on one principal surface and a zig-zag-shaped bus bar electrode and a plurality of finger electrodes on an opposite principal surface, the one principal surface being a light receiving surface, wherein
   the plurality of finger electrodes are on an almost entire region of the opposite principal surface and the zig-zag-shaped bus bar electrode is in direct physical contact with the plurality of finger electrodes; and
   a conductive connecting member electrically connecting the straight-shaped bus bar electrode or the zig-zag-shaped bus bar electrode of one of the solar cells with the straight-shaped bus bar electrode or the zig-zag-shaped bus bar electrode of another solar cell, wherein
   the conductive connecting member includes a first principal surface in an uneven shape and a second principal surface in a flat shape which is opposite from the first principal surface,
   the straight-shaped bus bar electrode is connected to the second principal surface of the conductive connecting member,
   the zig-zag-shaped bus bar electrode is connected to the first principal surface of the conductive connecting member,
   the zig-zag-shaped bus bar electrode has a larger region width in a short-side direction of the conductive connecting member than that of the straight-shaped bus bar electrode and has first and second peaks on opposite sides wherein each first and second peak extends beyond the width of the conductive connecting member, and wherein
   the straight-shaped bus bar electrode is covered by the conductive connecting member and
   at least a portion of the zig-zag-shaped bus bar electrode is not covered by the conductive connecting member; and
   the straight-shaped bus bar electrode on the one principal surface and the zig-zag-shaped bus bar electrode on the opposite principal surface are connected with the conductive connecting member by resin adhesive such that the straight-shaped bus bar electrode on the one principal surface and the zig-zag-shaped bus bar electrode on the opposite principal surface contacts the conductive connecting member via surrounding resin adhesive.

2. The solar cell module according to claim 1, wherein the uneven shape comprises a plurality of concave-convex portions that extend in a longitudinal direction of the conductive connecting member and wherein convex portions contact the zig-zag shape bus-bar electrode with resin adhesive within the concave portions.

3. The solar cell module according to claim 1, wherein the first principal surface is located on the one principal surface of the solar cell module, and the second principal surface is located on the opposite principal surface.

4. The solar cell module according to claim 1, wherein the width of the straight-shaped bus bar electrode on the one principal surface and the width of the zig-zag-shaped bus bar electrode on the opposite principal surface do not exceed 300 microns.

5. The solar cell module according to claim 1, wherein the periphery of the conductive connecting member is covered with silver.

6. The solar cell module according to claim 1, wherein the zig-zag-shaped bus bar electrode has a narrower line width and a larger region width in a short-side direction of the conductive connecting member compared to that of the straight-shaped bus bar electrode.

7. The solar cell module of claim 1, wherein the zig-zag-shaped bus bar electrode line width is between 80 and 500 microns.

8. A solar cell module comprising:
   solar cells, each comprising a front light receiving surface having a straight-shaped bus bar electrode, and an opposite surface having a zig-zag-shaped bus bar electrode in an arrangement direction and a plurality of finger electrodes, wherein
   the plurality of finger electrodes are on an almost entire region of the opposite surface and the zig-zag-shaped bus bar electrode is in direct physical contact with the plurality of finger electrodes, and
   for each solar cell to solar cell connection, a flat conductive connecting member in the arrangement direction that has a corrugated rough surface side and an opposite smooth surface side, wherein the conductive connecting member overlays and directly connects to the zig-zag-shaped bus bar of one of the solar cells via the corrugated rough surface side, and overlays and directly connects to the straight-shaped bus bar electrode of another of the solar cells via the smooth surface side;
   wherein
   the width of the straight-shaped bus bar electrode contacting the conductive connecting member is smaller than the width of the zig-zag-shaped bus bar that contacts the conductive connecting member, and
   the conductive connecting member covers the straight-shaped bus bar electrode on the front light receiving surface side of the respective solar cell and
   the conductive connecting member does not cover at least a portion of the zig-zag-shaped bus bar electrode on the opposite surface side of the respective solar cell, and
   wherein conductive connecting member resin adhesive connects the conductive connecting member to a solar cell on the rough uneven surface side of the conductive connecting member so that the contact area of the straight-shaped bus bar electrode to the conductive connecting member on the front light receiving surface side is larger than the contact area of the zig-zag-shaped bus bar electrode to the conductive connecting member on the opposite surface, thereby alleviating stress applied to the solar cell.

9. The solar cell module of claim 8, wherein the zig-zag-shaped bus bar electrode has first and second peaks on opposite sides wherein each first and second peak extends beyond the width of the conductive connecting member.

* * * * *